United States Patent
Hyland et al.

(10) Patent No.: US 6,788,119 B1
(45) Date of Patent: Sep. 7, 2004

(54) DELAY LINE CIRCUIT PROVIDING CLOCK PULSE WIDTH RESTORATION IN DELAY LOCK LOOPS

(75) Inventors: Paul G. Hyland, Naas, Co. (IE); Patrick T. Lynch, Edenderry, Co. (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/402,058

(22) Filed: Mar. 27, 2003

(51) Int. Cl.⁷ .................................................. H03L 7/06
(52) U.S. Cl. ...................................... 327/158; 327/153
(58) Field of Search ................................. 327/158, 153, 327/149, 159, 161, 271, 272, 276, 277, 284; 375/376

(56) References Cited

U.S. PATENT DOCUMENTS

| | | | | |
|---|---|---|---|---|
| 5,977,807 A | * | 11/1999 | Watanabe | 327/175 |
| 6,339,354 B1 | * | 1/2002 | Heightley | 327/278 |
| 6,369,624 B1 | * | 4/2002 | Wang et al. | 327/156 |
| 6,642,760 B1 | * | 11/2003 | Alon et al. | 327/158 |
| 6,646,484 B2 | * | 11/2003 | Ito | 327/158 |

* cited by examiner

*Primary Examiner*—Linh M. Nguyen
(74) *Attorney, Agent, or Firm*—Lois D. Cartier

(57) ABSTRACT

Delay lock loops (DLLs) that include delay line circuits with an optional clock pulse width restoration feature, and programmable delay circuits that enable the DLLs. A DLL can include optional inversions before and after at least one of the delay lines included in the DLL. Because two inversions are provided, the overall logic of the delay line is preserved. A DLL typically includes several different delay lines. Therefore, by selectively inverting the clock signal between the delay lines, the effect of each delay line on the clock pulse width can be balanced to provide an output clock signal having a pulse width closer to that of the input clock than would be achievable without the use of such selective inversion. In embodiments where the DLL forms a portion of a programmable logic device (PLD), the optional inversions can be controlled, for example, by configuration memory cells of the PLD.

42 Claims, 8 Drawing Sheets

DELAY LINE CIRCUIT PROVIDING CLOCK PULSE WIDTH RESTORATION IN DELAY LOCK LOOPS

FIELD OF THE INVENTION

The invention relates to delay lock loops (DLLs). More particularly, the invention relates to a DLL delay line that includes a clock pulse width restoration circuit.

BACKGROUND OF THE INVENTION

Clock signals are used in virtually every digital integrated circuit (IC) and electronic system to control timing. For example, whenever there is a rising edge on a clock signal, all the flip-flops in a circuit might change state. Clearly, the higher the frequency of the clock signal, the faster the circuit operates. Therefore, much attention has been given to achieving the highest possible clock speeds that can be supported by the clock circuitry.

One problem that typically develops when high-frequency clocks are used is the problem of "clock skew". Clock skew occurs when a clock signal is routed to two or more destinations and, because of varying delays on the clock paths, arrives at the targeted destinations at different times. For example, clock skew can occur when a clock signal is provided to the output pads and also to the internal circuitry of an IC. There might be, for example, a shorter delay in routing the clock signal to the output pads than there is in routing the clock signal to the internal circuitry. In this example, if the internal circuitry is driving the output pads, the clock skew can cause data errors.

A delay lock loop (DLL) is often used to remove clock skew. A DLL corrects the difference in timing between two skewed clock signals by adding a delay to the slower path. The added delay is the additional delay required to give the slower path exactly N clock periods more delay than the faster path, where N is a whole number. Thus, the two active edges arriving at the two target destinations are aligned, with N clock periods of delay between the two clock signals. A DLL typically continuously monitors the relative delay between a feedback clock signal and an input clock signal, adding an additional unit delay to the output clock signal when the feedback clock is too fast and subtracting a unit delay when the feedback clock is too slow.

DLLs typically contain several delay lines. A delay line is a number of delay elements coupled in series. The delay elements in a delay line are generally designed to have delays as nearly identical as possible. Output signals from the delay line are typically tapped after each delay element or each group of delay elements. The number of unit delays added to the input clock signal is determined by which tap signal is selected to provide the DLL output signal.

FIG. 1 shows a known DLL. The DLL of FIG. 1 includes a phase shifter circuit (clock phase shifter) 101 and two delay circuits A and B (102 and 103, respectively), all coupled in series. Each of these elements includes at least one delay line. In the pictured DLL, delay circuit A includes a 256-tap delay line, and delay circuit B includes four 128-tap delay lines 104a–104d. Delay circuit A is typically used to control feedback delays, while delay circuit B is used to generate quarter phasing of the input clock CLKIN (hence the four delay lines in delay circuit B).

Delay circuit B can include any number of delay lines having any number of taps. The more delay lines that are included in delay circuit B, the higher the number of clock phases that can be provided by the DLL. For example, when four delay lines are included, quarter phasing is supported by the DLL. When six delay lines are included, one-sixth phasing is supported, and so forth. Additionally, the greater the number of taps included in each delay line, the lower the input clock frequency that can be handled by delay circuit B.

Delay circuits B provides five output signals to an output generator circuit 105. Signal P00 is a delayed version of clock signal CLKIN_PS, provided by phase shifter circuit 101. Signals P25, P50, P75, and P100 are each shifted an additional quarter phase from clock signal P00. (In the present specification, the same reference characters are used to refer to terminals, signal lines, and their corresponding signals.) Output generator circuit 105, selects one of the delay line output signals as the output clock signal CLKOUT for the DLL. The output clock signal CLKOUT drives a clock network 106, e.g., for the integrated circuit including the DLL. From clock network 106 a feedback clock signal CLKFB feeds back to phase shifter circuit 101.

Phase shifter circuit 101 can optionally be used to add skew (delay offset) between signals CLKIN and CLKFB by phase shifting signals CLKIN and CLKFB to provide phase shifted signals CLKIN_PS and CLKFB_PS. Phase detector 108 compares the phase of the phase shifted feedback clock signal CLKFB_PS with the phase of the phase shifted input clock signal CLKIN_PS, and reports to the control logic (107) which of the two signals is ahead of the other. In response, the control logic instructs delay circuit A to either increase or decrease the amount of delay added to the clock path. Delay circuit A is "locked" when it has achieved phase alignment between signals CLKIN_PS and CLKFB_PS.

Phase Detector 109 compares the phase of signals P00 and P100, and reports to the control logic which signal is ahead of the other. In response, the control logic instruct delay circuit B to either increase or decrease the amount of delay added to the clock path, thereby bringing signals P00 and P100 closer and closer to being in phase. Delay circuit B is "locked" when it has achieved phase alignment between P00 & P100. Typically, this locking occurs when the delay through delay circuit B has become equal to the clock period of signal CLKIN. Control logic block 107 accepts input signals from blocks 101, 102, 103, 104a–d, 108, and 109, and provides output signals to blocks 101, 102, 103, 104a–d, 105, 108, and 109.

Each delay line typically includes a series of delay elements providing the tap signals and a multiplexer circuit that selects one of the tap signals as the delay line output signal. FIG. 2 illustrates an exemplary 128-tap delay line. For example, four delay lines similar to that shown in FIG. 2 can be used to implement delay circuit B of FIG. 1. However, typically all delay lines in the DLL use the same basic circuitry, to match performance and facilitate the tuning of the clock signal. The number of delay elements in each delay line can vary widely. Typically, the number of delay elements is selected to be a power of two, i.e., $2^N$, where N is an integer. This practice simplifies the multiplexer control logic.

Delay line 104 includes a series of 128 tap delays. Tap delay circuit 201 provides 128 tapped output signals D[0–127]. FIG. 3 shows one implementation of tap delay circuit 201, which includes 128 unit delay elements TAP0–TAP127 coupled in series. Each delay element provides one tap output signal. FIG. 4 shows one implementation of a single unit delay element TAPX, which includes four inverters 402a–402d coupled in series. The four inverters typically include transistors of the same size and configuration in each delay element, to equalize as much as possible the delay through each delay element. Many other implementations of a delay line delay element are well known and commonly used.

Returning now to FIG. 2, the tap signals are provided to the multiplexer circuit, which in this instance includes four multiplexer stages 202–205 and a multiplexer controller circuit 206. Multiplexer stage 1 is a 4-to-1 multiplexer that accepts 128 input tap signals and selects 32 of the input signals, which are provided to multiplexer stage 2. Multiplexer stage 2 is another 4-to-1 multiplexer that accepts 32 input tap signals and selects 8 of the signals, which are then provided to multiplexer stage 3. Multiplexer stage 3 reduces the number of tap signals to two, and the final multiplexer stage selects the one tap signal that is used as the output signal for the delay line.

The selection of tap signals is performed by multiplexer controller circuit 206. Multiplexer controller circuit 206 is controlled by state machine logic in control logic 107 (see FIG. 1). Thus, multiplexers 202–205 select a tap signal from tap delay circuit 201 based on the values of status signals received from the appropriate phase detector (phase detector 108 for delay circuit A, and phase detector 109 for delay circuit B).

FIG. 5 illustrates a phenomenon that often occurs in delay lines, and can seriously impede DLL performance. Delay lines typically have at least a slight imbalance between their rising and falling propagation delays. For example, each inverter in a delay line includes a P-channel transistor (which controls the rising propagation delay) and an N-channel transistor (which controls the falling propagation delay). Each inverter can be designed to balance these two delays, insofar as is possible. Typically, each delay element is intentionally designed to balance its aggregate rising and falling delays. However, due to external factors such as variations in process, voltage supplied to the transistors, and local temperature, the P-channel devices might be faster or slower than the N-channel devices. This imbalance can occur not only in delay lines, but in the multiplexer circuit as well, for example. However, the imbalance is magnified in the delay lines, due to the large number of serially-connected delay elements in these structures.

Suppose, for example, that a clock pulse includes a rising edge followed a short time later by a falling edge. If the rising propagation delay is consistently longer than the falling propagation delay, the rising edge of the clock pulse will be delayed relative to the falling edge. Thus, each delay element will provide a slightly narrower high clock pulse than the previous delay element in the delay line. If the delay line includes enough delay elements, and if the per element imbalance is large enough, an input clock pulse can completely vanish before the end of the delay line, as shown in FIG. 5. Conversely, in this example, if the rising propagation delay is consistently shorter than the falling propagation delay, the high pulse will gradually increase in width as it traverses the delay line.

FIG. 5 illustrates the effect of this phenomenon on a narrow clock pulse provided to the 256-tap delay line 102 of FIG. 1. If each delay element includes four inverters (as shown in FIG. 4), 256-tap delay line 102 includes up to 1024 inverters coupled in series, depending on which tap is selected. In the illustrated example, the rising propagation delay is consistently longer than the falling propagation delay. Therefore, a narrow high clock pulse (see waveform 501) provided to the input terminal IN of delay line 102 is eliminated entirely by the time the signal reaches the output terminal OUT (see waveform 502).

The effect of this deterioration is to limit the pulse width allowed on clock signals provided to the DLL that includes the delay line. This requirement, in turn, limits the frequency range of the supported input clock signal.

Therefore, it is desirable to provide delay lines for DLL circuits that can reduce or eliminate the effects of clock pulse width deterioration.

SUMMARY OF THE INVENTION

The invention provides delay lock loops (DLLs) that include delay line circuits with an optional clock pulse width restoration feature. According to one aspect of the invention, a DLL includes optional inversions before and after at least one of the delay lines included in the DLL. Because two inversions are provided, the overall logic of the delay line is preserved. A DLL typically includes several different delay lines. Therefore, by selectively inverting the clock signal between the delay lines, the effect of each delay line on the clock pulse width can be balanced to provide an output clock signal having a pulse width closer to that of the input clock than would be achievable without the use of such selective inversion. In embodiments where the DLL forms a portion of a programmable logic device (PLD), the optional inversions can be controlled, for example, by configuration memory cells of the PLD. Other aspects of the invention include various programmable delay circuits that can be used in DLLs as described above.

According to one embodiment, the invention provides a DLL that includes an input clock terminal, a feedback clock terminal, an output clock terminal, a phase shifter circuit, first and second phase detectors, first and second programmable inversion circuits, first and second delay circuits, an output generator circuit, and a control circuit.

The phase shifter circuit has a first input terminal coupled to the input clock terminal of the DLL, a second input terminal coupled to the feedback clock terminal of the DLL, and first and second output terminals. The first phase detector is coupled to the first and second output terminals of the phase shifter circuit. The first programmable inversion circuit has an input terminal coupled to the first output terminal of the phase shifter circuit, an output terminal, and a control terminal. The first delay circuit has an input terminal coupled to the output terminal of the first programmable inversion circuit, and an output terminal. The second programmable inversion circuit has an input terminal coupled to the output terminal of the first delay circuit, an output terminal, and a control terminal.

The second delay circuit has an input terminal coupled to the output terminal of the second programmable inversion circuit, and a plurality of output terminals. The second phase detector has first and second input terminals coupled to first and last ones of the output terminals of the second delay circuit. The output generator circuit has a plurality of input terminals coupled to the output terminals of the second delay circuit, and an output terminal coupled to the output clock terminal of the DLL. Finally, the control circuit is coupled to each of the phase shifter circuit, the first and second phase detectors, the first and second delay circuits, and the output generator circuit.

In some embodiments, the control terminal of the first programmable inversion circuit is coupled to the control terminal of the second programmable inversion circuit. Thus, both inversions are enabled or disabled together, preserving unchanged the logical functionality of the DLL. In some embodiments, the DLL forms a portion of a programmable logic device (PLD), and the control terminals of the programmable inversion circuits are coupled to one or more configuration memory cells of the PLD.

In some embodiments, the DLL forms a portion of an integrated circuit (IC) that also includes a clock network coupled between the output clock terminal and the input clock terminal of the DLL.

In some embodiments, the second delay circuit also includes third, fourth, and fifth programmable inversion circuits coupled to each clock input and output terminal. These additional programmable inversion circuits are controlled in a fashion similar to the first and second programmable inversion circuits.

In some embodiments, the phase shifter circuit also includes third, fourth, fifth, and sixth programmable inversion circuits coupled to each of the clock input and output terminals of a clock phase shifter. The third, fourth, fifth, and sixth programmable inversion circuits are controlled in a fashion similar to the first and second programmable inversion circuits.

According to another embodiment, a DLL includes an input clock terminal; a feedback clock terminal; an output clock terminal; a phase shifter circuit; first and second phase detectors; first and second delay circuits; first, second, and third programmable inversion circuits; an output generator circuit; and a control circuit.

The phase shifter circuit has a first input terminal coupled to the input clock terminal of the DLL, a second input terminal coupled to the feedback clock terminal of the DLL, and first and second output terminals. The first phase detector is coupled to the first and second output terminals of the phase shifter circuit. The first delay circuit has an input terminal coupled to the first output terminal of the phase shifter circuit, and an output terminal. The first programmable inversion circuit has an input terminal coupled to the output terminal of the first delay circuit, an output terminal, and a control terminal. The second programmable inversion circuit has an input terminal coupled to the output terminal of the first programmable inversion circuit, an output terminal, and a control terminal.

The second delay circuit has an input terminal coupled to the output terminal of the first programmable inversion circuit, and an output terminal. The third programmable inversion circuit has an input terminal coupled to the output terminal of the second delay circuit, an output terminal, and a control terminal.

The second phase detector has a first input terminal coupled to the output terminal of the second programmable inversion circuit and a second input terminal coupled to the output terminal of the third programmable inversion circuit. The output generator circuit has a first input terminal coupled to the output terminal of the second programmable inversion, a second input terminal coupled to the output terminal of the third programmable inversion circuit, and an output terminal coupled to the output clock terminal of the DLL. Finally, the control circuit is coupled to each of the phase shifter circuit, the first and second phase detectors, the first and second delay circuits, and the output generator circuit.

According to yet another embodiment, a DLL includes an input clock terminal; a feedback clock terminal; an output clock terminal, first, second, third, and fourth programmable inversion circuits; a phase shifter circuit; first and second phase detectors, first and second delay circuits; an output generator circuit, and a control circuit.

The first programmable inversion circuit has an input terminal coupled to the input clock terminal of the DLL, an output terminal, and a control terminal. The second programmable inversion circuit has an input terminal coupled to the feedback clock terminal of the DLL, an output terminal, and a control terminal. The phase shifter circuit has a first input terminal coupled to the output terminal of the first programmable inversion circuit, a second input terminal coupled to the output terminal of the second programmable inversion circuit, and first and second output terminals. The third programmable inversion circuit has an input terminal coupled to the first output terminal of the phase shifter circuit, an output terminal, and a control terminal. The fourth programmable inversion circuit has an input terminal coupled to the second output terminal of the phase shifter circuit, an output terminal, and a control terminal. The first phase detector is coupled to the output terminals of the first and second programmable inversion circuits.

The first delay circuit has an input terminal coupled to the output terminal of the third programmable inversion circuit, and an output terminal. The second delay circuit has an input terminal coupled to the output terminal of the first delay circuit, and a plurality of output terminals. The second phase detector has a first input terminal coupled to a first one of the output terminals of the second delay circuit and a second input terminal coupled to the last one of the output terminals of the second delay circuit. The output generator circuit has a plurality of input terminals coupled to the output terminals of the second delay circuit, and an output terminal coupled to the output clock terminal of the DLL. Finally, the control circuit is coupled to each of the phase shifter circuit, the first and second phase detectors, the first and second delay circuits, and the output generator circuit.

According to another aspect of the invention, a programmable delay circuit includes an input terminal, an output terminal, first and second programmable inversion circuits, and a delay line. The first programmable inversion circuit has an input terminal coupled to the input terminal of the delay circuit, an output terminal, and a control terminal. The delay line has an input terminal coupled to the output terminal of the first programmable inversion circuit, and an output terminal. Finally, the second programmable inversion circuit has an input terminal coupled to the output terminal of the delay line, an output terminal, and a control terminal.

In some embodiments, the control terminal of the first programmable inversion circuit is coupled to the control terminal of the second programmable inversion circuit. In some embodiments, the delay circuit forms a portion of a PLD, and the control terminal of the first programmable inversion circuit is coupled to a first configuration memory cell of the PLD. In other embodiments, the control terminal of the first programmable inversion circuit is coupled to a first configuration memory cell of the PLD, and the control terminal of the second programmable inversion circuit is coupled to a second configuration memory cell of the PLD.

According to another embodiment, a programmable delay circuit includes an input terminal; first and second output terminals; first, second, and third programmable inversion circuits; and a first delay line. The first programmable inversion circuit has an input terminal coupled to the input terminal of the programmable delay circuit, an output terminal, and a control terminal. The second programmable inversion circuit has an input terminal coupled to the output terminal of the first programmable inversion circuit, an output terminal coupled to the first output terminal of the programmable delay circuit, and a control terminal. The first delay line has an input terminal coupled to the output terminal of the first programmable inversion circuit, and an output terminal. Finally, the third programmable inversion circuit has an input terminal coupled to the output terminal of the first delay line, an output terminal coupled to the second output terminal of the programmable delay circuit, and a control terminal.

According to another embodiment, a programmable delay circuit includes an input terminal; an output terminal; first, second, third, and fourth programmable inversion circuits; and first and second delay lines. The first programmable inversion circuit has an input terminal coupled to the input terminal of the programmable delay circuit, an output terminal, and a control terminal. The first delay line has an input terminal coupled to the output terminal of the first programmable inversion circuit, and an output terminal. The second programmable inversion circuit has an input terminal coupled to the output terminal of the first delay line, an output terminal, and a control terminal. The third programmable inversion circuit has an input terminal coupled to the output terminal of the second programmable inversion circuit, an output terminal, and a control terminal. The second delay line has an input terminal coupled to the output terminal of the second programmable inversion circuit, and an output terminal. Finally, the fourth programmable inversion circuit has an input terminal coupled to the output terminal of the second delay line, and an output terminal coupled to the output terminal of the programmable delay circuit.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 5:
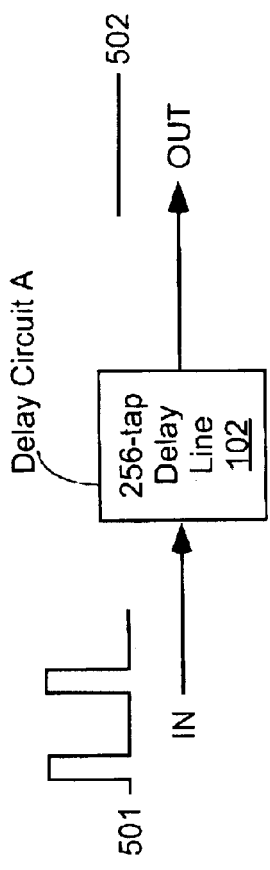
FIG. 5 illustrates the phenomenon of clock pulse width deterioration occurring in one of the delay circuits of FIG. 1.
Figure 6:
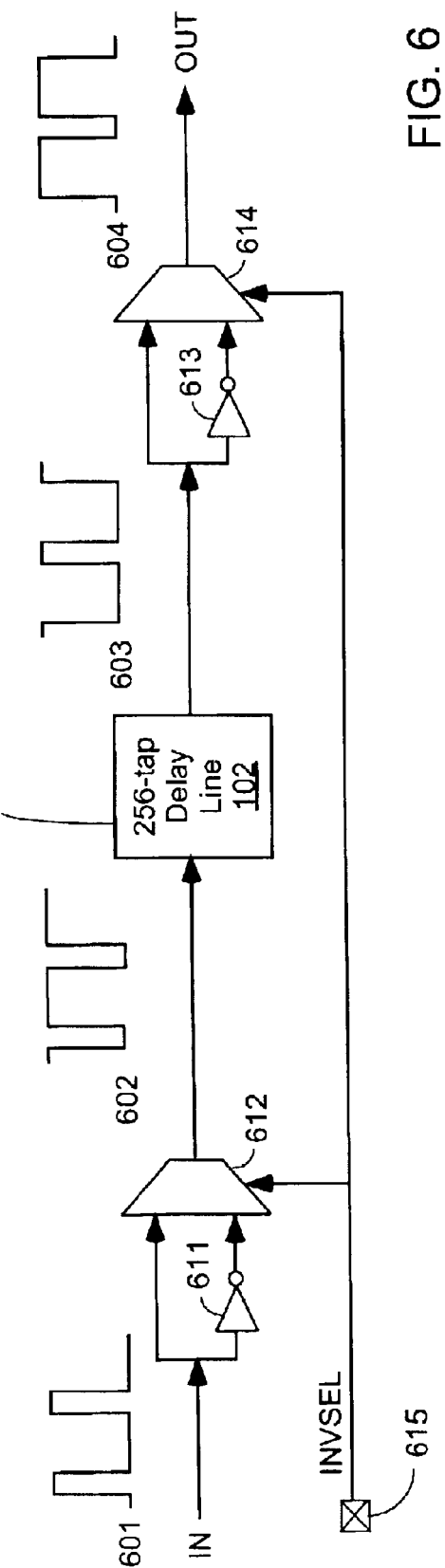
FIG. 6 illustrates a circuit for clock pulse restoration in a delay line according to an embodiment of the invention.

FIG. 6 shows how the delay circuit of FIG. 5 can be modified to provide an optional clock pulse width restoration feature in accordance with one aspect of the present invention. Suppose that the same conditions are in effect as in the example of FIG. 5, that is, the rising propagation delay is consistently longer than the falling propagation delay supplying a waveform with a short high pulse (see waveform 601) to delay circuit A could result in an output signal with no high pulses at all, as in FIG. 5. However, if an inverted version of the clock signal IN is provided to delay circuit A, the input signal will instead consist of a series of long high pulses (see waveform 602). Although the pulses will be narrowed by passing through delay line 102 (see waveform 603), the pulses are still wide enough to detect.

By inverting the clock pulse again (see waveform 604), the logical function of the delay line is preserved, and an output clock signal OUT having the same frequency and sense as the input clock signal IN emerges from the circuit. However, the pulse width of the output signal OUT might be different from the pulse width of the input signal IN, depending on the duty cycle of the input signal and the amount of clock pulse width deterioration that has taken place.

In FIG. 6, the programmable inversion circuits are implemented by providing both the clock signal and an inverted version of the clock signal to a multiplexer. In the pictured embodiment, the first programmable inversion circuit (before the delay line) is implemented using inverter 611 and multiplexer 612. The second programmable inversion circuit (after the delay line) is implemented using inverter 613 and multiplexer 614. In some embodiments, inverters 611 and 613 are identical, and multiplexers 612 and 614 are also identical, in terms of transistor sizing. Each of multiplexers 612 and 614 is preferably controlled by the same signal, in this case signal INVSEL. However, the two multiplexers can be individually controlled if desired.

In the pictured embodiment, the delay line forms a portion of a programmable logic device (PLD) controlled by configuration memory cells, and the control terminals of multiplexers 612, 614 are coupled to one of the configuration memory cells 615. However, in other embodiments, the multiplexers are controlled by one or two active signals provided from elsewhere in the circuit or from outside the circuit.

Figure 7:
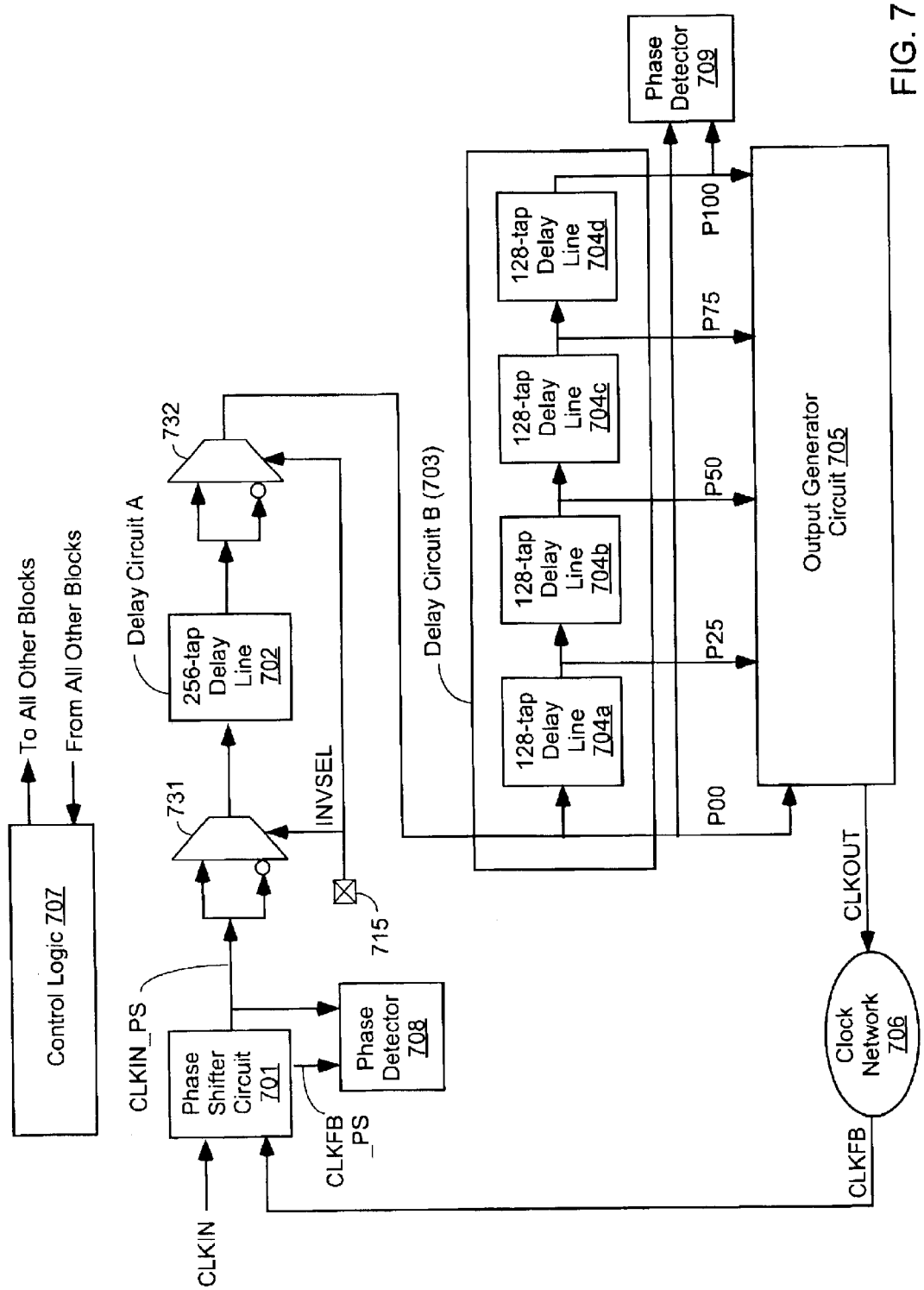
FIG. 7 shows a first example of how the invention can be applied to a DLL according to an embodiment of the invention.

FIG. 7 shows one way in which the delay circuit of the invention can be applied to a DLL. The DLL of FIG. 7 is similar to the DLL of FIG. 1, except that programmable inversion circuits have been inserted before and after delay circuit A. The programmable inversion circuits (731 and 732) can be, for example, implemented as shown in FIG. 6. However, other ways of implementing a programmable inversion can also be used.

The double inversion of the clock signal in the DLL of FIG. 7 has the following effect when desired (e.g., when the input clock signal has a very long or very short pulse width relative to the period of the clock, or when external factors affecting the rising and falling propagation delays are known to be present), the programmable inversion circuits are enabled. Thus, the rise/fall delay imbalance is partially or entirely cancelled, and the deterioration of the clock pulse width is averted. The net effect is a DLL that has a better tolerance for input clock pulse width and frequency range than previously known DLLs.

Note that in some applications it might be desirable to enable only one of the two programmable inversion circuits. For example, in a DLL, it might be desirable to provide an inverted output clock signal. Therefore, the two multiplexers 712 and 714 are individually controlled in some embodiments.

Figure 8:
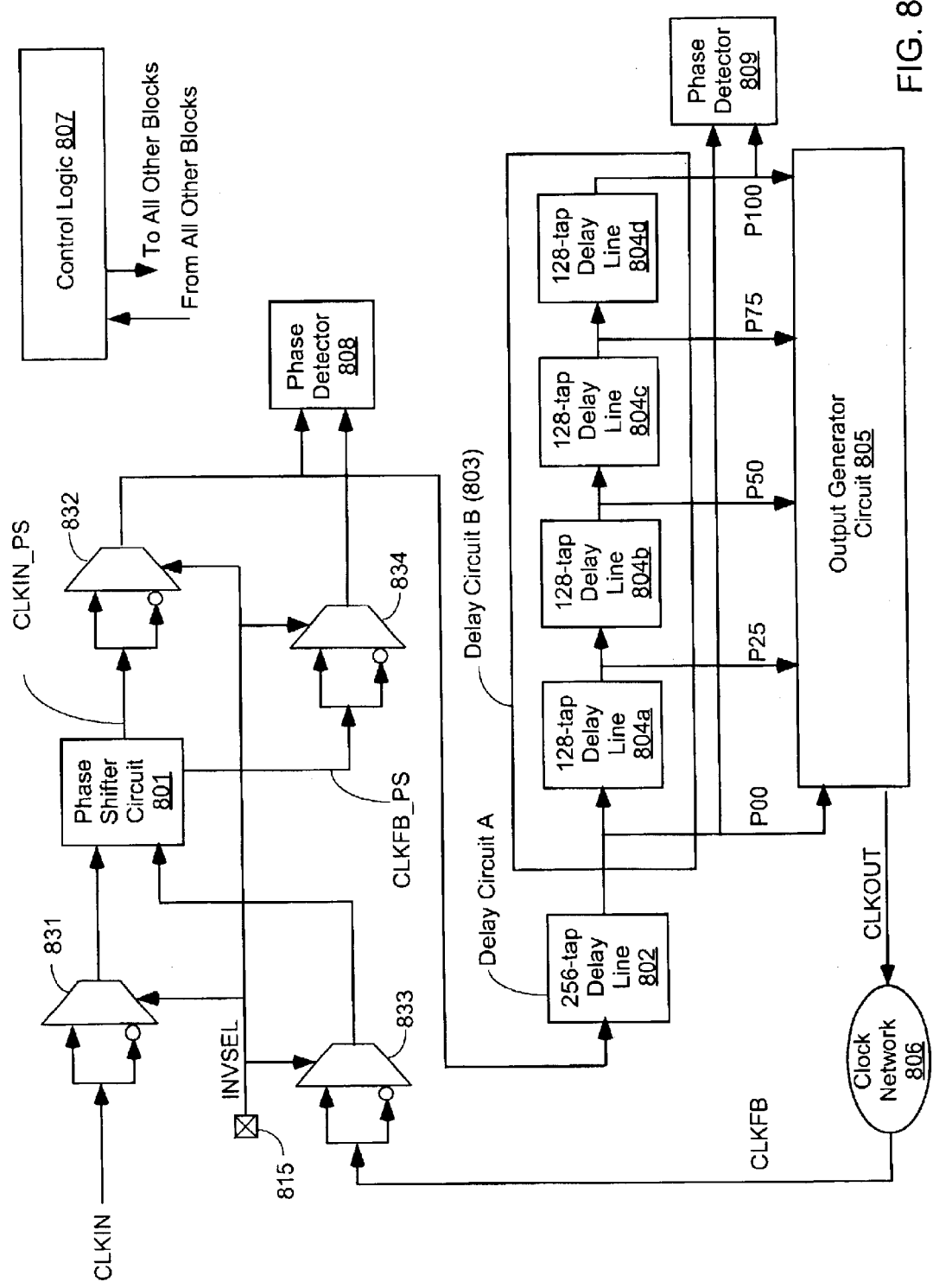
FIG. 8 shows a second example of how the invention can be applied to a DLL according to an embodiment of the invention.

FIG. 8 shows how the inventive concept can be applied to a phase shifter circuit in a DLL. The DLL of FIG. 8 is similar to the DLL of FIG. 1, except that programmable inversion circuits have been inserted on each clock input and output terminal of phase shifter circuit 801. Each programmable inversion circuit 831–834 can be, for example, similar to those shown in FIGS. 6 and 7.

Figure 1:
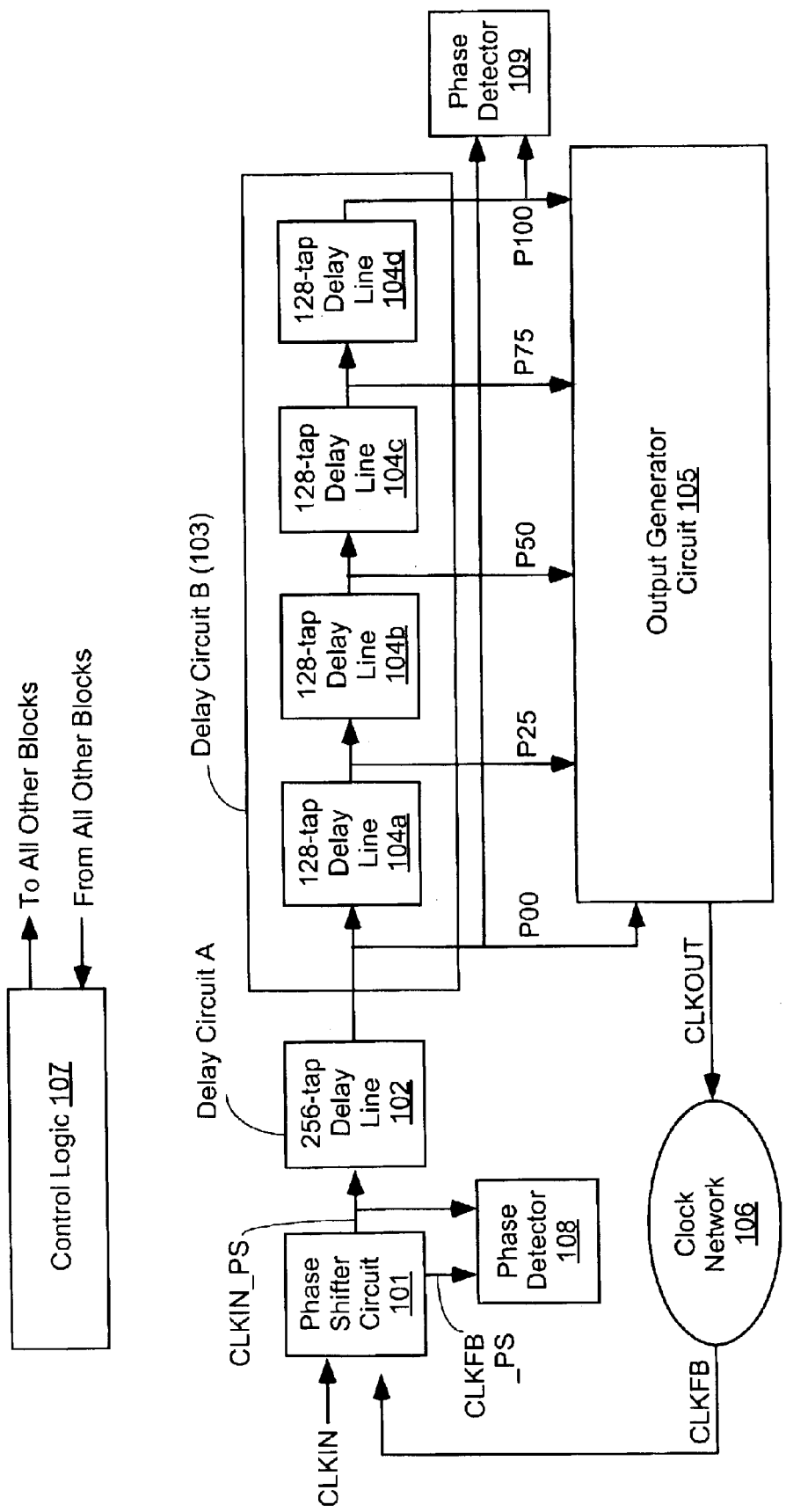
FIG. 1 shows a prior art delay lock loop (DLL).
Figure 2:
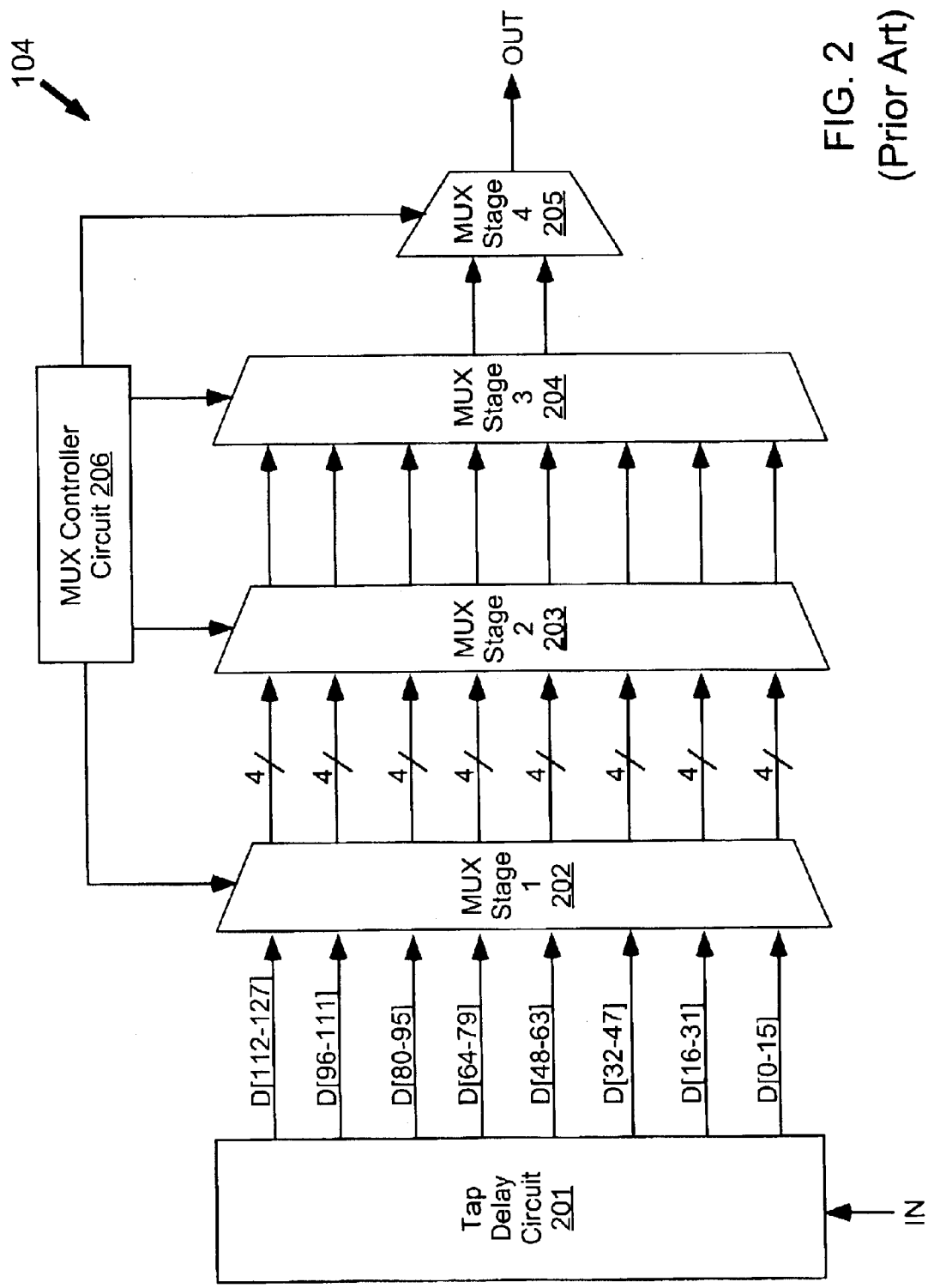
FIG. 2 shows a prior art delay circuit that can be used in the DLL of FIG. 1.
Figure 3:
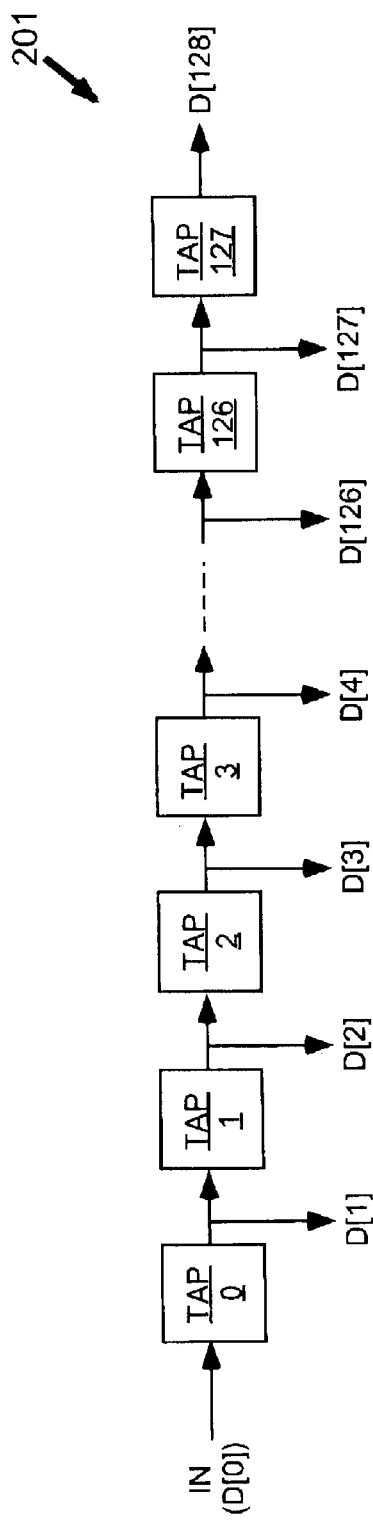
FIG. 3 shows a prior art tap delay circuit that can be used in the delay circuit of FIG. 2.
Figure 4:
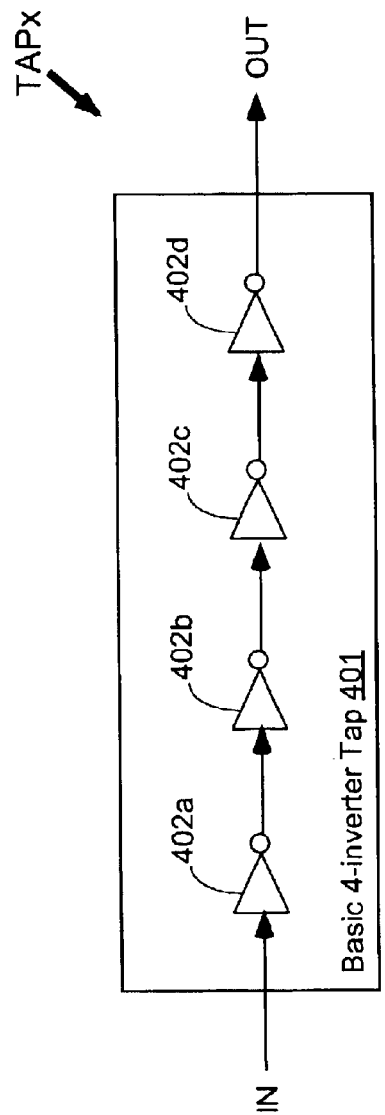
FIG. 4 shows a delay element that can be used in the tap delay circuit of FIG. 3.
Figure 9:
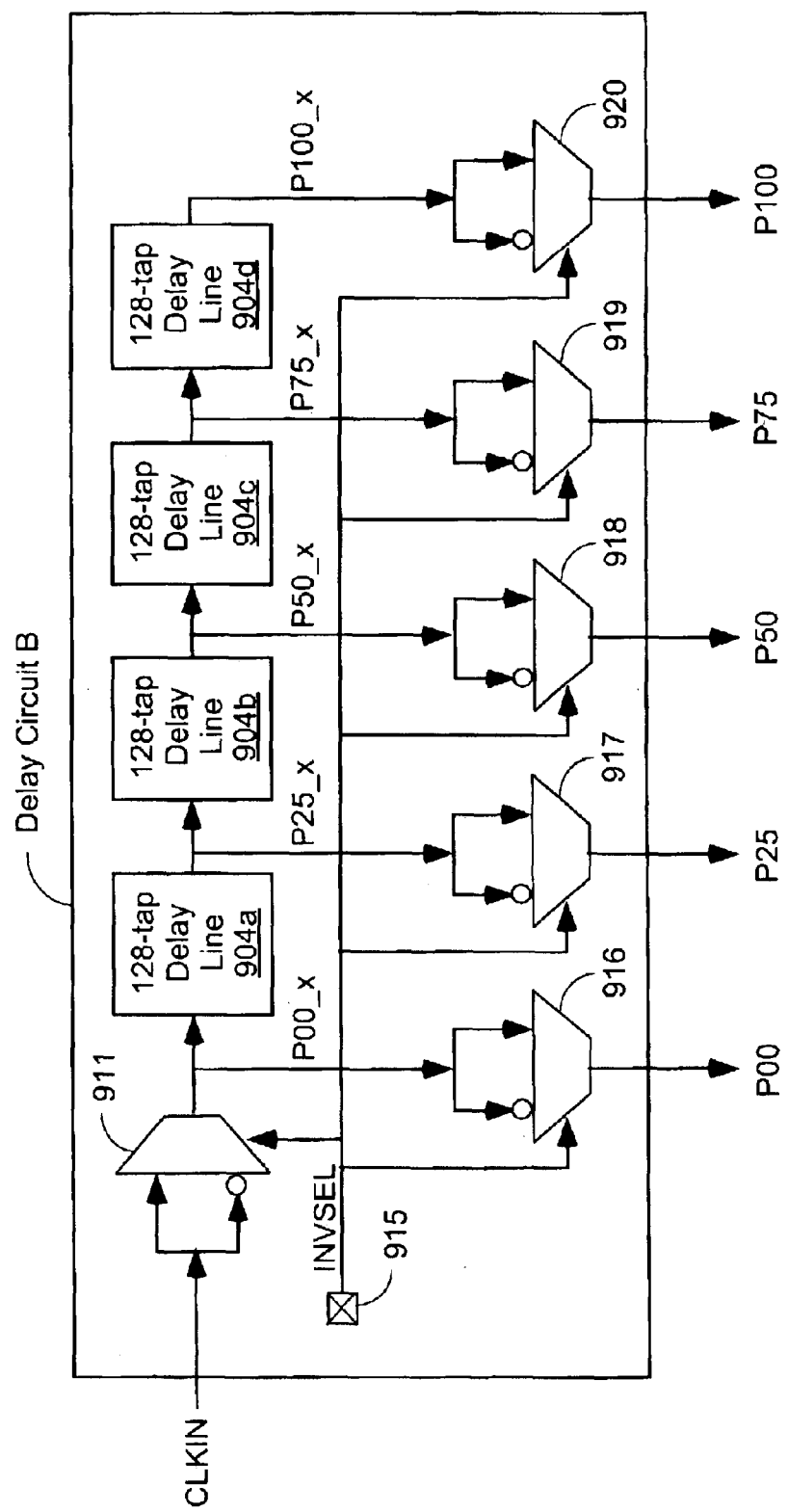
FIG. 9 shows a first programmable delay circuit according to an embodiment of the invention.

The inventive concept can also be applied to a series of delay lines, as in delay circuit B of FIG. 1. FIG. 9 shows an embodiment in which programmable inversion circuits (911 and 916–920) are added to each clock input and output terminal of delay circuit B. In effect, a typical delay circuit has been modified by surrounding the circuit with a "wall" of programmable inversion circuits. No matter which tap is selected, the selected clock signal will have passed through two inversions, therefore, the selected clock signal will have the same sense as the input clock signal.

Figure 10:
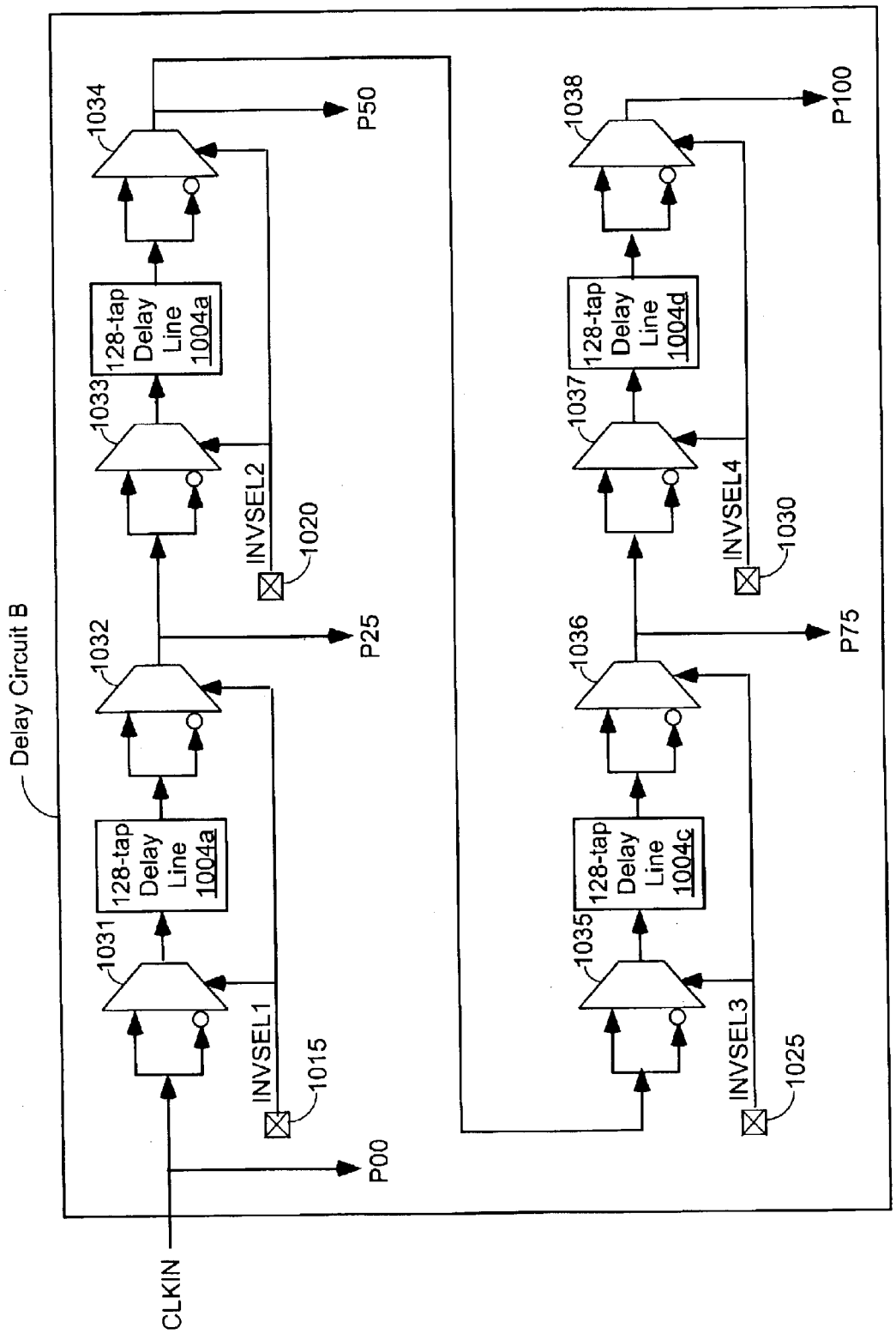
FIG. 10 shows a second programmable delay circuit according to an embodiment of the invention.

It can also be desirable to separately control the sense of the clock signals in various portions of a delay line, e.g., for each tap section. This capability allows a finer control of the rise/fall imbalance and pulse width deterioration. FIG. 10 shows the addition of programmable inversion circuits before and after each delay line 1004a–1004d in delay circuit B. In the embodiment of FIG. 10, each pair of programmable inversion circuits is independently controlled (by signals INVSEL1–INVSEL4). Thus, depending on the severity of the rise/fall imbalance, the appropriate number of inversion circuits can be enabled to cancel out or substantially alleviate the deterioration of the clock pulse width. Each pair of programmable inversion circuits can optionally be controlled either in unison with or in opposition to the other pairs, or each circuit can be independently controlled, as desired.

In other embodiments (not shown), the programmable inversion circuits are paired together in ways other than that shown in FIG. 10. For example, a programmable delay circuit can include a first delay line preceded by a first inversion circuit and followed by a second inversion circuit. A second delay line is preceded by a third inversion circuit (which is coupled to the output terminal of the second inversion circuit) and followed by a fourth inversion circuit. In one embodiment, the first and fourth inversion circuits are paired (i.e., their control terminals are coupled together), and the second and third inversion circuits are paired. In another embodiment, the first and third inversion circuits are paired, and the second and fourth inversion circuits are paired. In these embodiments, the overall delay circuit is non-inverting, but some of the interim output signals might be inverted from the input and output signals.

The figures herein show the addition of sets of programmable inversion circuits to each of the phase shifter circuit, delay circuit A, and delay circuit B (the entire circuit, or each delay line within the circuit). However, the invention can also be applied to more than one of these circuits in a single DLL.

Not all known DLLs include each and every element of the DLL shown in FIG. 1. Some DLLs, for example, do not include a second delay circuit with four delay lines. It will be apparent to one skilled in the art after reading this specification that the present invention can be practiced within these and other architectural variations. For example, the invention can be applied to any DLL or other circuit that includes delay lines. However, the invention is particularly effective in cases where a series of delay lines is present, because of the cumulative effect of any rise/fall imbalance in this type of circuit.

Those having skill in the relevant arts of the invention will now perceive various modifications and additions that can be made as a result of the disclosure herein. For example, the above text describes the circuits of the invention in the context of programmable logic devices (PLDs). However, the circuits of the invention can also be implemented in other integrated circuits, including non-programmable circuits. The circuits of the invention can also be implemented in other electronic systems, for example, in printed circuit boards including discrete devices.

Further, delay circuits, delay lines, delay elements, inverters, programmable inversion circuits, multiplexers, multiplexer control circuits, phase shifter circuits, clock phase shifters, clock networks, and other components other than those described herein can be used to implement the invention. Active-high signals can be replaced with active-low signals by making straightforward alterations to the circuitry, such as are well known in the art of circuit design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A delay lock loop (DLL), comprising:
   an input clock terminal;
   a feedback clock terminal;
   an output clock terminal;
   a phase shifter circuit having a first input terminal coupled to the input clock terminal of the DLL, a second input terminal coupled to the feedback clock terminal of the DLL, and first and second output terminals;
   a first phase detector coupled to the first and second output terminals of the phase shifter circuit;
   a first programmable inversion circuit having an input terminal coupled to the first output terminal of the phase shifter circuit, an output terminal, and a control terminal;
   a first delay circuit having an input terminal coupled to the output terminal of the first programmable inversion circuit, and further having an output terminal;
   a second programmable inversion circuit having an input terminal coupled to the output terminal of the first delay circuit, an output terminal, and a control terminal;
   a second delay circuit having an input terminal coupled to the output terminal of the second programmable inversion circuit, and further having a plurality of output terminals;
   a second phase detector having first and second input terminals coupled to first and last ones of the output terminals of the second delay circuit;
   an output generator circuit having a plurality of input terminals coupled to the output terminals of the second delay circuit, and further having an output terminal coupled to the output clock terminal of the DLL; and
   a control circuit coupled to each of the phase shifter circuit, the first and second phase detectors, the first and second delay circuits, and the output generator circuit.

2. The DLL of claim 1, wherein the control terminal of the first programmable inversion circuit is coupled to the control terminal of the second programmable inversion circuit.

3. The DLL of claim 2, wherein the DLL forms a portion of a programmable logic device (PLD), and the control terminal of the first programmable inversion circuit is coupled to a configuration memory cell of the PLD.

4. The DLL of claim 1, wherein:
the DLL forms a portion of a programmable logic device (PLD);
the DLL further comprises first and second configuration memory cells;
the control terminal of the first programmable inversion circuit is coupled to the first configuration memory cell; and
the control terminal of the second programmable inversion circuit is coupled to the second configuration memory cell.

5. The DLL of claim 1, wherein the DLL forms a portion of an integrated circuit (IC) comprising a clock network coupled between the output clock terminal and the input clock terminal of the DLL.

6. The DLL of claim 1, wherein the second delay circuit comprises:
a third programmable inversion circuit having an input terminal coupled to the output terminal of the second programmable inversion circuit, an output terminal, and a control terminal;
a fourth programmable inversion circuit having an input terminal coupled to the output terminal of the third programmable inversion circuit, an output terminal coupled to the first one of the output terminals of the second delay circuit, and a control terminal;
a delay line having an input terminal coupled to the output terminal of the third programmable inversion circuit, and further having an output terminal; and
a fifth programmable inversion circuit having an input terminal coupled to the output terminal of the delay line, an output terminal coupled to the last one of the output terminals of the second delay circuit, and a control terminal.

7. The DLL of claim 6, wherein the control terminal of the third programmable inversion circuit is coupled to the control terminal of the fourth and fifth programmable inversion circuits.

8. The DLL of claim 7, wherein the DLL forms a portion of a programmable logic device (PLD), and the control terminal of the third programmable inversion circuit is coupled to a configuration memory cell of the PLD.

9. The DLL of claim 6, wherein:
the DLL forms a portion of a programmable logic device (PLD);
the DLL further comprises third, fourth, and fifth configuration memory cells;
the control terminal of the third programmable inversion circuit is coupled to the third configuration memory cell;
the control terminal of the fourth programmable inversion circuit is coupled to the fourth configuration memory cell; and
the control terminal of the fifth programmable inversion circuit is coupled to the fifth configuration memory cell.

10. The DLL of claim 1, wherein the phase shifter circuit comprises:
a third programmable inversion circuit having an input terminal coupled to the clock input terminal of the DLL, an output terminal, and a control terminal;
a fourth programmable inversion circuit having an input terminal coupled to the feedback clock terminal of the DLL, an output terminal, and a control terminal;
a clock phase shifter having a first input terminal coupled to the output terminal of the third programmable inversion circuit, a second input terminal coupled to the output terminal of the fourth programmable inversion circuit, and first and second output terminals;
a fifth programmable inversion circuit having an input terminal coupled to the first output terminal of the clock phase shifter, an output terminal coupled to the input terminal of the first programmable inversion circuit, and a control terminal; and
a sixth programmable inversion circuit having an input terminal coupled to the second output terminal of the clock phase shifter, an output terminal coupled to an input terminal of the first phase detector, and a control terminal.

11. The DLL of claim 10, wherein the control terminals of the third, fourth, fifth, and sixth programmable inversion circuits are coupled together.

12. The DLL of claim 11, wherein the DLL forms a portion of a programmable logic device (PLD), and the control terminal of the third programmable inversion circuit is coupled to a configuration memory cell of the PLD.

13. The DLL of claim 10, wherein:
the DLL forms a portion of a programmable logic device (PLD);
the DLL further comprises third, fourth, fifth, and sixth configuration memory cells;
the control terminal of the third programmable inversion circuit is coupled to the third configuration memory cell;
the control terminal of the fourth programmable inversion circuit is coupled to the fourth configuration memory cell;
the control terminal of the fifth programmable inversion circuit is coupled to the fifth configuration memory cell; and
the control terminal of the sixth programmable inversion circuit is coupled to the sixth configuration memory cell.

14. A delay lock loop (DLL), comprising:
an input clock terminal;
a feedback clock terminal;
an output clock terminal;
a phase shifter circuit having a first input terminal coupled to the input clock terminal of the DLL, a second input terminal coupled to the feedback clock terminal of the DLL, and first and second output terminals;
a first phase detector coupled to the first and second output terminals of the phase shifter circuit;
a first delay circuit having an input terminal coupled to the first output terminal of the phase shifter circuit, and further having an output terminal;
a first programmable inversion circuit having an input terminal coupled to the output terminal of the first delay circuit, an output terminal, and a control terminal;
a second programmable inversion circuit having an input terminal coupled to the output terminal of the first programmable inversion circuit, an output terminal, and a control terminal;
a second delay circuit having an input terminal coupled to the output terminal of the first programmable inversion circuit, and further having an output terminal;

a third programmable inversion circuit having an input terminal coupled to the output terminal of the second delay circuit, an output terminal, and a control terminal;

a second phase detector having a first input terminal coupled to the output terminal of the second programmable inversion circuit and a second input terminal coupled to the output terminal of the third programmable inversion circuit;

an output generator circuit having a first input terminal coupled to the output terminal of the second programmable inversion circuit, a second input terminal coupled to the output terminal of the third programmable inversion circuit, and an output terminal coupled to the output clock terminal of the DLL; and a control circuit coupled to each of the phase shifter circuit, the first and second phase detectors, the first and second delay circuits, and the output generator circuit.

15. The DLL of claim 14, wherein the control terminal of the first programmable inversion circuit is coupled to the control terminal of the second and third programmable inversion circuits.

16. The DLL of claim 15, wherein the DLL forms a portion of a programmable logic device (PLD), and the control terminal of the first programmable inversion circuit is coupled to a configuration memory cell of the PLD.

17. The DLL of claim 14, wherein:
the DLL forms a portion of a programmable logic device (PLD);
the DLL further comprises first, second, and third configuration memory cells;
the control terminal of the first programmable inversion circuit is coupled to the first configuration memory cell;
the control terminal of the second programmable inversion circuit is coupled to the second configuration memory cell; and
the control terminal of the third programmable inversion circuit is coupled to the third configuration memory cell.

18. The DLL of claim 14, wherein the DLL forms a portion of an integrated circuit (IC) comprising a clock network coupled between the output clock terminal and the input clock terminal of the DLL.

19. The DLL of claim 14, wherein the phase shifter circuit comprises:
a fourth programmable inversion circuit having an input terminal coupled to the clock input terminal of the DLL, an output terminal, and a control terminal;
a fifth programmable inversion circuit having an input terminal coupled to the feedback clock terminal of the DLL, an output terminal, and a control terminal;
a clock phase shifter having a first input terminal coupled to the output terminal of the fourth programmable inversion circuit, a second input terminal coupled to the output terminal of the fifth programmable inversion circuit, and first and second output terminals;
a sixth programmable inversion circuit having an input terminal coupled to the first output terminal of the clock phase shifter, an output terminal coupled to the input terminal of the first delay circuit, and a control terminal; and
a seventh programmable inversion circuit having an input terminal coupled to the second output terminal of the clock phase shifter, an output terminal coupled to an input terminal of the first phase detector, and a control terminal.

20. The DLL of claim 19, wherein the control terminals of the fourth, fifth, sixth, and seventh programmable inversion circuits are coupled together.

21. The DLL of claim 20, wherein the DLL forms a portion of a programmable logic device (PLD), and the control terminal of the fourth programmable inversion circuit is coupled to a configuration memory cell of the PLD.

22. The DLL of claim 19, wherein:
the DLL forms a portion of a programmable logic device (PLD);
the DLL further comprises fourth, fifth, sixth, and seventh configuration memory cells;
the control terminal of the fourth programmable inversion circuit is coupled to the fourth configuration memory cell;
the control terminal of the fifth programmable inversion circuit is coupled to the fifth configuration memory cell;
the control terminal of the sixth programmable inversion circuit is coupled to the sixth configuration memory cell; and
the control terminal of the seventh programmable inversion circuit is coupled to the seventh configuration memory cell.

23. A delay lock loop (DLL), comprising:
an input clock terminal;
a feedback clock terminal;
an output clock terminal;
a first programmable inversion circuit having an input terminal coupled to the input clock terminal of the DLL, an output terminal, and a control terminal;
a second programmable inversion circuit having an input terminal coupled to the feedback clock terminal of the DLL, an output terminal, and a control terminal;
a phase shifter circuit having a first input terminal coupled to the output terminal of the first programmable inversion circuit, a second input terminal coupled to the output terminal of the second programmable inversion circuit, and first and second output terminals;
a third programmable inversion circuit having an input terminal coupled to the first output terminal of the phase shifter circuit, an output terminal, and a control terminal;
a fourth programmable inversion circuit having an input terminal coupled to the second output terminal of the phase shifter circuit, an output terminal, and a control terminal;
a first phase detector coupled to the output terminals of the first and second programmable inversion circuits;
a first delay circuit having an input terminal coupled to the output terminal of the third programmable inversion circuit, and further having an output terminal;
a second delay circuit having an input terminal coupled to the output terminal of the first delay circuit, and further having a plurality of output terminals;
a second phase detector having a first input terminal coupled to a first one of the output terminals of the second delay circuit and a second input terminal coupled to a last one of the output terminals of the second delay circuit;
an output generator circuit having a plurality of input terminals coupled to the output terminals of the second delay circuit, and further having an output terminal coupled to the output clock terminal of the DLL; and a control circuit coupled to each of the phase shifter circuit, the first and second phase detectors, the first and second delay circuits, and the output generator circuit.

24. The DLL of claim 23, wherein the control terminal of the first programmable inversion circuit is coupled to the control terminals of the second, third, and fourth programmable inversion circuits.

25. The DLL of claim 24, wherein the DLL forms a portion of a programmable logic device (PLD), and the control terminal of the first programmable inversion circuit is coupled to a configuration memory cell of the PLD.

26. The DLL of claim 23, wherein:
the DLL forms a portion of a programmable logic device (PLD);
the DLL further comprises first, second, third, and fourth configuration memory cells;
the control terminal of the first programmable inversion circuit is coupled to the first configuration memory cell;
the control terminal of the second programmable inversion circuit is coupled to the second configuration memory cell;
the control terminal of the third programmable inversion circuit is coupled to the third configuration memory cell; and
the control terminal of the fourth programmable inversion circuit is coupled to the fourth configuration memory cell.

27. The DLL of claim 23, wherein the DLL forms a portion of an integrated circuit (IC) comprising a clock network coupled between the output clock terminal and the input clock terminal of the DLL.

28. A programmable delay circuit, comprising:
an input terminal;
an output terminal;
a first programmable inversion circuit having an input terminal coupled to the input terminal of the delay circuit, an output terminal, and a control terminal, wherein the first programmable inversion circuit programmable selects between inverting and non-inverting functions;
a first delay line having an input terminal coupled to the output terminal of the first programmable inversion circuit, and further having an output terminal; and
a second programmable inversion circuit having an input terminal coupled to the output terminal of the first delay line, an output terminal coupled to the output terminal of the programmable delay circuit, and a control terminal, wherein the second programmable inversion circuit programmable selects between inverting and non-inverting functions.

29. The programmable delay circuit of claim 28, wherein the control terminal of the first programmable inversion circuit is coupled to the control terminal of the second programmable inversion circuit.

30. The programmable delay circuit of claim 29, wherein:
the delay circuit forms a portion of a programmable logic device (PLD); and
the control terminal of the first programmable inversion circuit is coupled to a first configuration memory cell of the PLD.

31. The programmable delay circuit of claim 28, wherein:
the delay circuit forms a portion of a programmable logic device (PLD);
the control terminal of the first programmable inversion circuit is coupled to a first configuration memory cell of the PLD; and
the control terminal of the second programmable inversion circuit is coupled to a second configuration memory cell of the PLD.

32. A programmable delay circuit, comprising:
an input terminal;
first and second output terminals;
a first programmable inversion circuit having an input terminal coupled to the input terminal of the programmable delay circuit, an output terminal, and a control terminal;
a second programmable inversion circuit having an input terminal coupled to the output terminal of the first programmable inversion circuit, an output terminal coupled to the first output terminal of the programmable delay circuit, and a control terminal;
a first delay line having an input terminal coupled to the output terminal of the first programmable inversion circuit, and further having an output terminal; and
a third programmable inversion circuit having an input terminal coupled to the output terminal of the first delay line, an output terminal coupled to the second output terminal of the programmable delay circuit, and a control terminal.

33. The programmable delay circuit of claim 32, wherein the control terminal of the first programmable inversion circuit is coupled to the control terminals of the second and third programmable inversion circuits.

34. The programmable delay circuit of claim 33, wherein the DLL forms a portion of a programmable logic device (PLD), and the control terminal of the first programmable inversion circuit is coupled to a configuration memory cell of the PLD.

35. The programmable delay circuit of claim 32, wherein:
the programmable delay circuit forms a portion of a programmable logic device (PLD);
the programmable delay circuit further comprises first, second, and third configuration memory cells;
the control terminal of the first programmable inversion circuit is coupled to the first configuration memory cell;
the control terminal of the second programmable inversion circuit is coupled to the second configuration memory cell; and
the control terminal of the third programmable inversion circuit is coupled to the third configuration memory cell.

36. The programmable delay circuit of claim 32, further comprising:
a third output terminal;
a second delay line having an input terminal coupled to the output terminal of the first delay line, and further having an output terminal; and
a fourth programmable inversion circuit having an input terminal coupled to the output terminal of the second delay line, an output terminal coupled to the third output terminal of the programmable delay circuit, and a control terminal.

37. A programmable delay circuit, comprising:
an input terminal;
an output terminal;
a first programmable inversion circuit having an input terminal coupled to the input terminal of the programmable delay circuit, an output terminal, and a control terminal, wherein the first programmable inversion circuit programmably selects between inverting and non-inverting functions;

a first delay line having an input terminal coupled to the output terminal of the first programmable inversion circuit, and further having an output terminal;

a second programmable inversion circuit having an input terminal coupled to the output terminal of the first delay line, an output terminal, and a control terminal, wherein the second programmable inversion circuit programmably selects between inverting and non-inverting functions;

a third programmable inversion circuit having an input terminal coupled to the output terminal of the second programmable inversion circuit, an output terminal, and a control terminal, wherein the third programmable inversion circuit programmably selects between inverting and non-inverting functions;

a second delay line having an input terminal coupled to the output terminal of the third programmable inversion circuit, and further having an output terminal; and a fourth programmable inversion circuit having an input terminal coupled to the output terminal of the second delay line, and further having an output terminal coupled to the output terminal of the programmable delay circuit, wherein the fourth Programmable inversion circuit programmably selects between inverting and non-inverting functions.

38. The programmable delay circuit of claim 37, wherein:

the control terminal of the first programmable inversion circuit is coupled to the control terminal of the second programmable inversion circuit; and the control terminal of the third programmable inversion circuit is coupled to the control terminal of the fourth programmable inversion circuit.

39. The programmable delay circuit of claim 38, wherein:

the programmable delay circuit forms a portion of a programmable logic device (PLD);

the control terminal of the first programmable inversion circuit is coupled to a first configuration memory cell of the PLD; and the control terminal of the third programmable inversion circuit is coupled to a second configuration memory cell of the PLD.

40. The programmable delay circuit of claim 37, wherein:

the first and second programmable inversion circuits form a first pair of circuits;

the third and fourth programmable inversion circuits form a second pair of circuits; and at least one of the first and second pairs of circuits has a single control terminal coupled to the control terminals of both programmable inversion circuits included therein.

41. The programmable delay circuit of claim 37, wherein:

the first and fourth programmable inversion circuits form a first pair of circuits;

the second and third programmable inversion circuits form a second pair of circuits; and at least one of the first and second pairs of circuits has a single control terminal coupled to the control terminals of both programmable inversion circuits included therein.

42. The programmable delay circuit of claim 37, wherein:

the first and third programmable inversion circuits form a first pair of circuits;

the second and fourth programmable inversion circuits form a second pair of circuits; and at least one of the first and second pairs of circuits has a single control terminal coupled to the control terminals of both programmable inversion circuits included therein.

* * * * *